United States Patent [19]
Kwon

[11] Patent Number: 5,998,830
[45] Date of Patent: Dec. 7, 1999

[54] FLASH MEMORY CELL

[75] Inventor: Oh Won Kwon, Kyungki-Do, Rep. of Korea

[73] Assignee: Hyundai Electronics Industries Co., Ltd., Kyungki-do, Rep. of Korea

[21] Appl. No.: 08/999,349

[22] Filed: Dec. 29, 1997

[30] Foreign Application Priority Data

Dec. 28, 1996 [KR] Rep. of Korea ........................ 96-74944

[51] Int. Cl.$^6$ .................................................. H01L 29/78
[52] U.S. Cl. ........................... 257/315; 257/322; 257/350
[58] Field of Search .................................. 257/314, 315, 257/322, 347, 350

[56] References Cited

U.S. PATENT DOCUMENTS

| | | | |
|---|---|---|---|
| 3,755,721 | 8/1973 | Frohman-Bentchkowsky | 257/315 |
| 4,233,616 | 11/1980 | Kyomasu et al. | 257/315 |
| 4,429,326 | 1/1984 | Watanabe et al. | 257/322 |
| 5,440,158 | 8/1995 | Sung-Mu | 257/314 |
| 5,465,231 | 11/1995 | Ohsaki | 257/315 |
| 5,488,243 | 1/1996 | Tsuruta et al. | 257/314 |
| 5,504,706 | 4/1996 | D'Arrigo et al. | 365/185.5 |

FOREIGN PATENT DOCUMENTS

| | | | |
|---|---|---|---|
| 0 623 959 A2 | 4/1994 | European Pat. Off. | 257/315 |
| 2 299 451 | 3/1996 | United Kingdom | 257/315 |

OTHER PUBLICATIONS

"Thin–film SOI devices: A Perspective", J.P. Colling, Microelectronic Engineering, Aug. 1998, pp. 127–147.

Primary Examiner—Donald L. Monin, Jr.
Attorney, Agent, or Firm—Scott C. Harris, Esq.

[57] ABSTRACT

A flash memory cell of the present invention comprises a silicon substrate consisted of an insulating film and a silicon film in which a first and second channel regions are formed and a pair of gate electrodes formed on the first and second channel regions, respectively. Each channel region has a drain region and source region formed at both sides thereof.

3 Claims, 3 Drawing Sheets

FLASH MEMORY CELL

BACKGROUND OF INVENTION

1. Field of the Invention

The present invention relates to a flash memory cell, in particular, to a flash memory cell which can increase an operating speed and decrease a power consumption.

2. Brief Description of the Prior Art

In general, the memory device such as a flash electrically erasable and programmable read only memory cell (EEPROM) has both functions of electrically programming and erasing, and is classified into a stack-gate type and split-gate type depending on the shape of a gate electrode thereof. Now, the structure and operation of conventional stack-gate type flash memory cell will be described below.

In the conventional stack-gate type flash memory cell, as shown in FIG. 1, a tunnel oxide film 2, a floating gate 3, a dielectric film 4 and a control gate 5 are sequentially stacked on a silicon substrate 1 to form a gate electrode G, and a source and drain regions 7 and 6 are formed in the silicon substrate 1 at both sides of the gate electrode G, respectively. The operation of programming and erasing of the flash memory cell as described above is as follows.

To program an information to the flash memory cell, that is, to charge the floating gate 3 with an electric charge, high voltage of +12 V is applied to the control gate 5, supply voltage of +5 V is applied to the drain region 6, and the ground voltage is applied to the source region 7 and the silicon substrate 1, respectively.

Then, a channel is formed in the silicon substrate 1 below the floating gate 3 due to the high voltage applied to the control gate 5, and the high electric field zone is formed in the silicon substrate 1 at the side of the drain region 6 due to the voltage applied to the drain region 6. At this time, a part of electrons existing in the channel receive the energy from the high electric field zone so as to be hot electrons, and a part of the hot electrons are injected to the floating gate 3 through the tunnel oxide film 2 by an electrical field formed in a vertical direction due to the high voltage applied to the control gate 5. Therefore, the threshold voltage ($V_T$) of the flash memory cell rises due to the injection of the hot electron.

To erase the information programmed in the flash memory cell, that is, to discharge the electric charge stored in the floating gate 3, the ground voltage is applied to the control gate 5 and the silicon substrate 1, high voltage of +12V is applied to the source region 7, and the drain region 3 is floated. Then, the electrons injected into the floating gate 3 are moved to the source region 7 due to the F-N (fowler-nordheim) tunneling phenomenon, whereby the threshold voltage $V_T$ of the memory cell is lowered.

The conventional flash memory cell as described above has two gates (floating gate and control gate) formed of a polysilicon. Therefore, two insulating films, that is, the tunneling oxide film 2 and the dielectric film 4 are necessary to isolate between the silicon substrate 1 and the floating gate 3 and between the floating gate 3 and the control gate 5, respectively. However, in the process of forming the insulating films, it is difficult to control precisely a characteristic of the insulating films and to form the insulating films having a high reliability. In addition, a negative charge pump circuit must be comprised in the device to operate the memory cell, therefore, a high integration of the device is difficult. Furthermore, a power consumption increases due to the junction leakage.

SUMMARY OF THE INVENTION

Therefore, the object of the present invention is to provide a flash memory cell which can solve the disadvantages described above.

To achieve this object, a flash memory cell of the present invention comprises a silicon substrate consisted of an insulating film and a silicon film in which a first and second channel regions are formed, each channel region has a drain region and source region formed at both sides thereof. A pair of gate electrodes are formed on the first and second channel regions, respectively, each electrode is isolated electrically with the silicon film by a dielectric film, thereby forming a first and second transistors.

The first channel region and second channel region are formed by injecting opposite type impurity ions from each other, the drain and source regions of the first and second transistors are formed by injecting same type impurity ions.

BRIEF DESCRIPTION OF THE DRAWING

Other objects and advantages of the present invention will be understood by reading the detailed explanation of the embodiment with reference to the accompanying drawings in which.

DETAILED DESCRIPTION OF THE DRAWINGS

Figure 1:
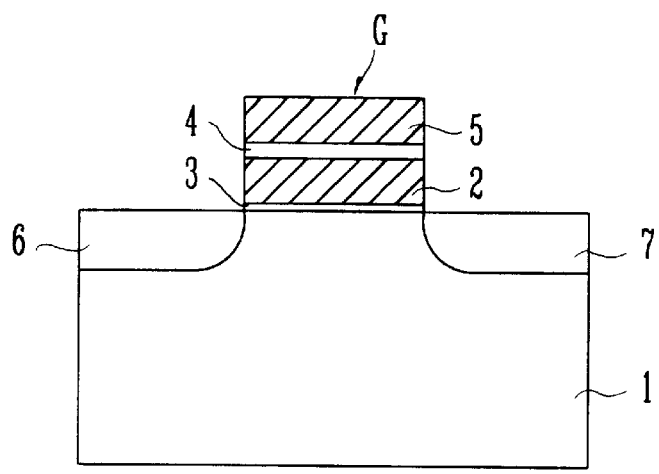
FIG. 1 is a sectional view of a device for illustrating a conventional flash memory cell.
Figure 2A:
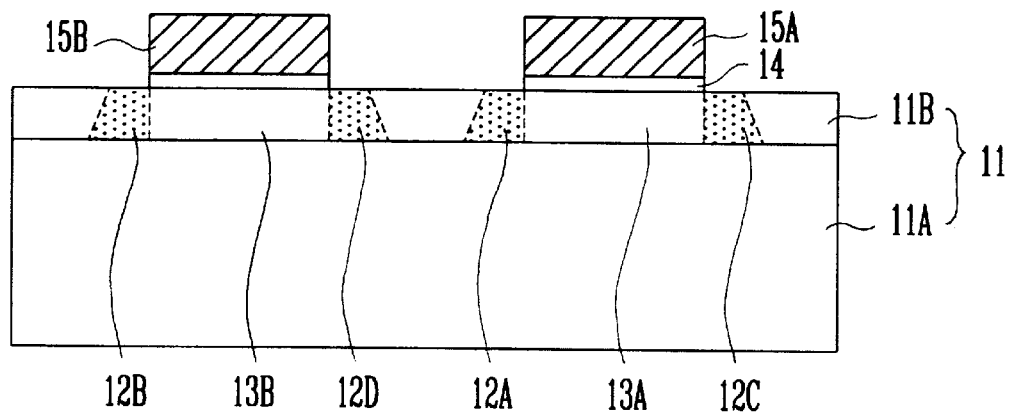
FIG. 2A and FIG. 2B are sectional views of a device for illustrating a flash memory cell of the present invention.

FIG. 2A is a sectional view of a device for illustrating a flash memory cell of the present invention, a silicon substrate 11 used in the present invention has a SOI (silicon on insulator) structure consisted of an insulating film 11A and a silicon film 11B. A first channel region 13A, into which an impurity ion (for example, N-type impurity ion) is injected, and a second channel region 13B, into which an impurity ion (for example, P-type impurity ion) is injected, are formed on the silicon film 11B of the silicon substrate 11. A drain region 12A and a source region 12C, into which an impurity ion (for example, N+ type impurity ion) is injected, are formed at both sides of the first channel region 13A, a drain region 12B and a source region 12D, into which an impurity ion (for example, N+ type impurity ion) is injected, are formed at both sides of the second channel region 13B. An dielectric film 14 and a polysilicon film (not shown) are formed sequentially on the silicon film 11B including the first and second channel regions 13A and 13B. Then, the dielectric film 14 and the polysilicon film are patterned so that a first gate electrode 15A and a second gate electrode 15B are formed on the first channel region 13A and second channel region 13B, respectively.

Figure 2B:
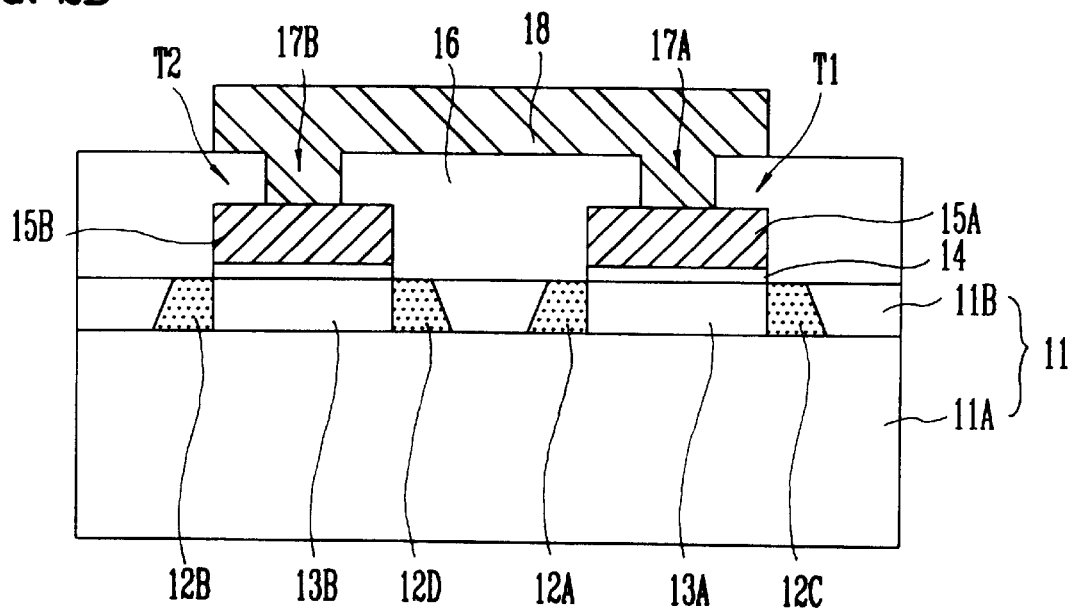

Referring to FIG. 2B, an interlayer insulating film 16 is formed on the silicon film 11B including the first and second gate electrodes 15A and 15B, and then the interlayer insulating film 16 is patterned so that a first and a second contact holes 17A and 17B are formed to expose a portion of the first and second gate electrodes 15A and 15B, respectively. A conductive film 18 is formed on the interlayer insulating film 16 including the first and second contact holes 17A and 17B.

The flash memory cell of the present invention has a pair of transistors, as shown in FIG. 2B. That is, a first transistor T1 is consisted of the gate electrode 15A, the drain and source regions 12A and 12C formed at both sides of the first channel region 13A, and a second transistor T2 is consisted of the gate electrode 15B, the drain and source regions 12B and 12D formed at both sides of the second channel region 13B.

The operation of programming, erasing and reading of the flash memory cell as described above will be described with reference to FIG. 3A through FIG. 3D.

Figure 3A:
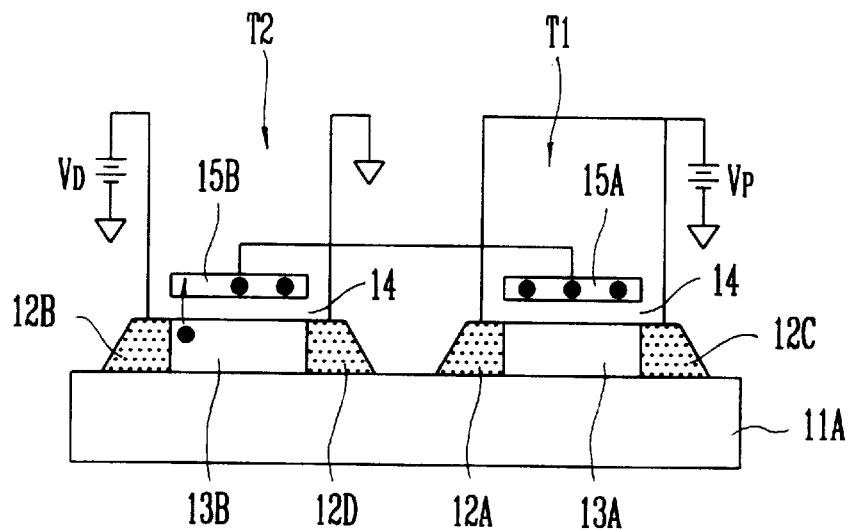
FIG. 3A to FIG. 3D are views for illustrating operations of a flash memory cell of the present invention.

To program an information to the flash memory cell, that is, to charge the gate electrodes 15A and 15B with an electric charge, high voltage $V_P$ is applied to the drain and source regions 12A and 12C of the first transistor T1 as shown in FIG. 3A. Therefore, a voltage is introduced to the gate electrode 15B of the second transistor T2 by a capacitance coupling phenomenon. At this time, since a supply voltage $V_D$ is applied to the drain region 12B of the second transistor T2 and the source region 12D of the second transistor T2 is grounded, a part of electrons existing in the second channel region 13B of the second transistor T2 receive the energy from the high electric field zone so as to be hot electrons, and a part of the hot electrons are injected to the gate electrodes 15A and 15B of the first and second transistors T1 and T2 through the dielectric film 14 by an electrical field formed in a vertical direction due to the voltage introduced to the gate electrode 15B of the second transistor T2. Therefore, the threshold voltage ($V_T$) of the flash memory cell rises due to the injection of the hot electron.

Figure 3B:
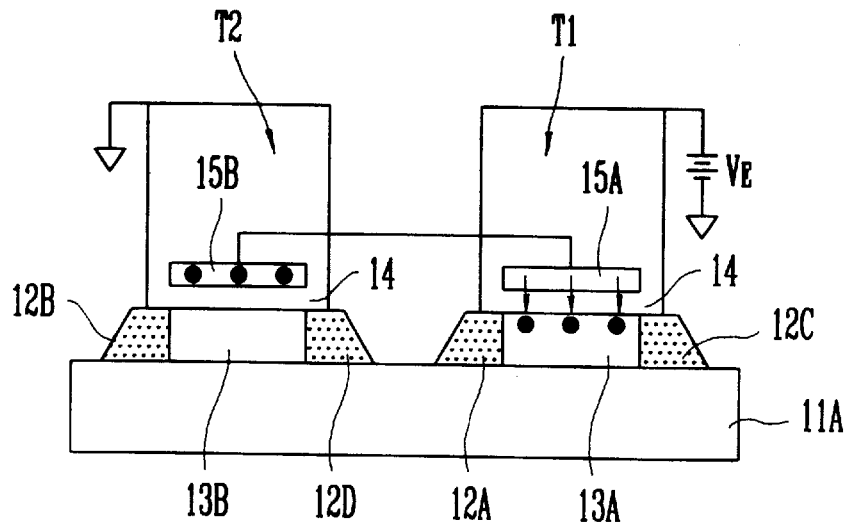

To erase the information programmed to the flash memory cell, that is, to discharge the electric charge stored in the gate electrodes 15A and 15B, high voltage $V_E$ for erasing is applied to the drain and source regions 12A and 12C of the first transistor T1, the drain and source regions 12B and 12D of the second transistor T2 are grounded, as shown in FIG. 3B. Then, the electrons injected into the gate electrodes 15A and 15B are moved to the first channel region 13A of the first transistor T1 through the dielectric film 14 due to the F-N (fowler-nordheim) tunneling phenomenon, whereby the threshold voltage $V_T$ of the memory cell is lowered.

Figure 3C:
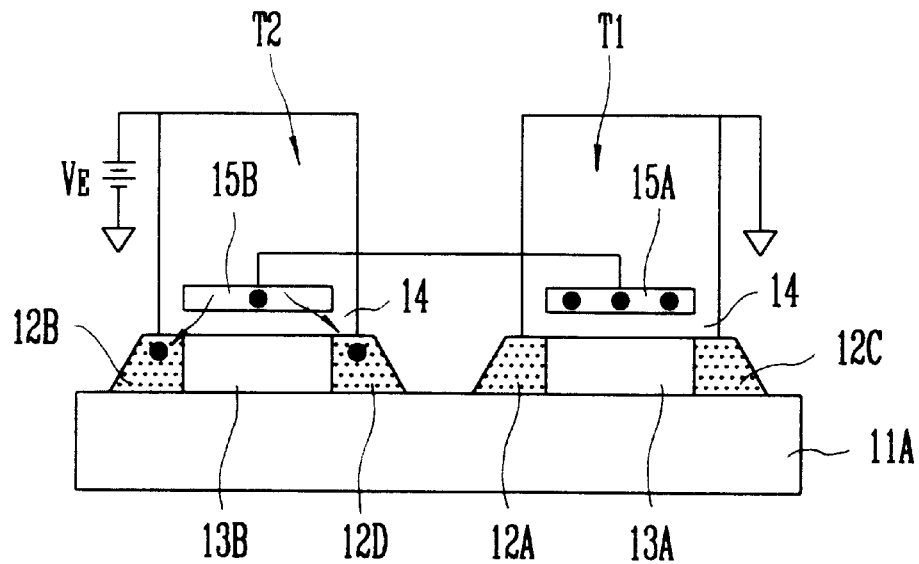

Another method of erasing the information programmed to the flash memory is as follow. High voltage $V_E$ for erasing is applied to the drain and source regions 12B and 12D of the second transistor T2, the drain and source regions 12A and 12C of the first transistor T1 are grounded, as shown in FIG. 3C. Then, the electrons injected into the gate electrodes 15A and 15B are moved to the source and drain regions 12B and 12D of the second transistor T2 through the dielectric film 14 due to the F-N (fowler-nordheim) tunneling phenomenon, whereby the threshold voltage $V_T$ of the memory cell is lowered.

Figure 3D:
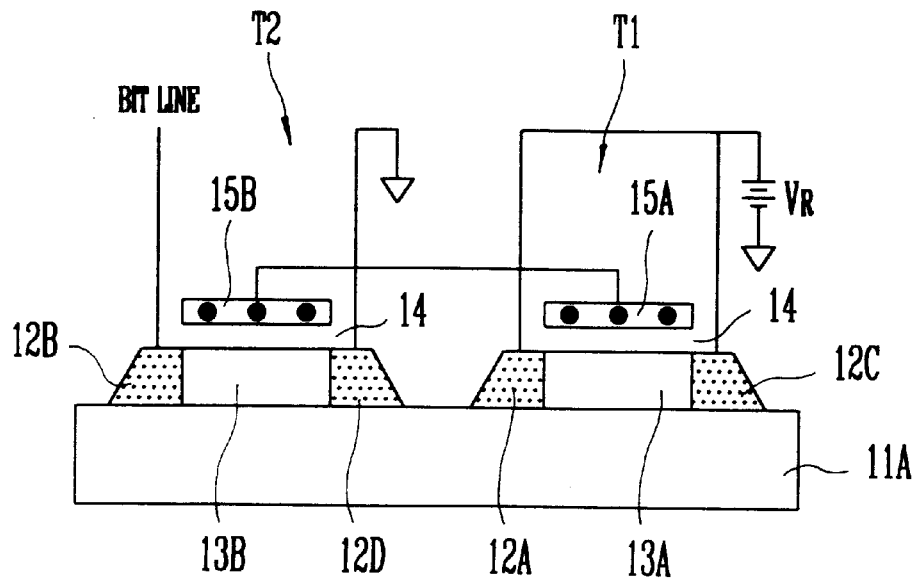

To read the information programmed to the flash memory cell, high voltage $V_R$ for reading is applied to the drain and source regions 12A and 12C of the first transistor T1, respectively. The source region 12D of the second transistor T2 is grounded, and the drain region 12B of the second transistor T2 is connected to a bit line, as shown in FIG. 3D. Thereinafter, the presence of a current flowed through the bit line is detected. At this time, quantity of current flowed through the bit line is changed according to the presence of the electron injected into the gate electrodes 15A and 15B.

In the flash memory cell of the present invention, since the dielectric film and polysilicon film (gate electrode) are formed in stack on the substrate having a SOI (silicon on insulator) structure, the process for manufacturing the memory cell can be simplified. In conventional flash memory cell, a negative voltage must be applied for operating the cell, however, a negative voltage is not required for operating the memory cell according to the present invention. Therefore, there is no need to form a negative charge pump circuit in the device, as a result, high integration of device can be performed easily. Also, a junction leakage is prevented perfectly due to the structure of the flash memory cell according to the present invention so that a power consumption is reduced and operating speed is increased.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory cell comprising:
   a first channel region formed on a first portion of an insulating film of a SOI substrate, including a first impurity ion in said first channel region;
   a first drain region and a first source region respectively formed of said first channel region, wherein a second impurity ion is said first drain and source regions;
   a first dielectric film formed on said first channel region;
   a first polysilicon film formed on said first dielectric film;
   a second channel region formed on a second portion of said insulating film of said SOI substrate, wherein a third impurity ion is included in said second channel region;
   a second drain region and a second source region formed at both sides of said second channel region, respectively, wherein said second impuriry ion is injected in said second drain and source regions;
   a second dielectric film formed on said second channel region;
   a second polysilicon film formed on said second dielectric film;
   an interlayer insulating film on the entire structure including said first and second polysilicon films;
   first and second contact holes formed in said interlayer insulating film to expose said first and second polysilicon films, respectively; and
   a conductive film formed on said inter-layer insulating film to connect said first and second polysilicon films.

2. The flash memory cell of claim 1, wherein said first impurity ion is N type and said third impurity ion is P type.

3. The flash memory cell of claim 1, wherein said second impurity ion is N+type.

* * * * *